United States Patent [19]

Bader

[11] 4,074,197
[45] Feb. 14, 1978

[54] SYSTEM FOR ROTATING SMALL PERMANENT MAGNETS WHILE ADJUSTING AND SIMULTANEOUSLY SENSING THE MAGNETIC MOMENTS THEREOF

[75] Inventor: Clifford John Bader, West Chester, Pa.

[73] Assignee: Burroughs Corporation, Detroit, Mich.

[21] Appl. No.: 717,648

[22] Filed: Aug. 25, 1976

[51] Int. Cl.² ............................................. G01R 33/12
[52] U.S. Cl. .................................... 324/205; 361/146; 361/148
[58] Field of Search .................... 324/42, 45; 361/143, 361/146, 147, 148, 149

[56] References Cited

U.S. PATENT DOCUMENTS

| 2,240,749 | 5/1941 | Beechlyn | 361/149 |
| 2,869,075 | 1/1959 | Ireland | 324/42 |
| 3,235,776 | 2/1966 | Ireland | 324/45 |
| 3,596,144 | 7/1971 | Cunningham | 361/148 |
| 3,624,457 | 11/1971 | Lombard | 361/148 |

FOREIGN PATENT DOCUMENTS

| 882,033 | 5/1943 | France | 361/149 |
| 382,155 | 5/1973 | U.S.S.R. | 361/149 |

Primary Examiner—Robert J. Corcoran
Attorney, Agent, or Firm—Francis A. Varallo; Edmund M. Chung; Kevin R. Peterson

[57] ABSTRACT

The present disclosure describes apparatus for the production of small permanent bar magnets accurately adjusted to a stable, predetermined value of magnetic moment. In accordance with the invention, the readout of the moment of the magnet under adjustment is provided simultaneously with the degaussing process, so that the operation becomes a coordinated one rather than the present day process involving trial-and-error. The system provides easily obtainable time-saving consistent results and is especially useful where large numbers of magnets of predetermined moment must be produced. The real-time sensing capability of the system renders it particularly suitable for automation.

9 Claims, 1 Drawing Figure

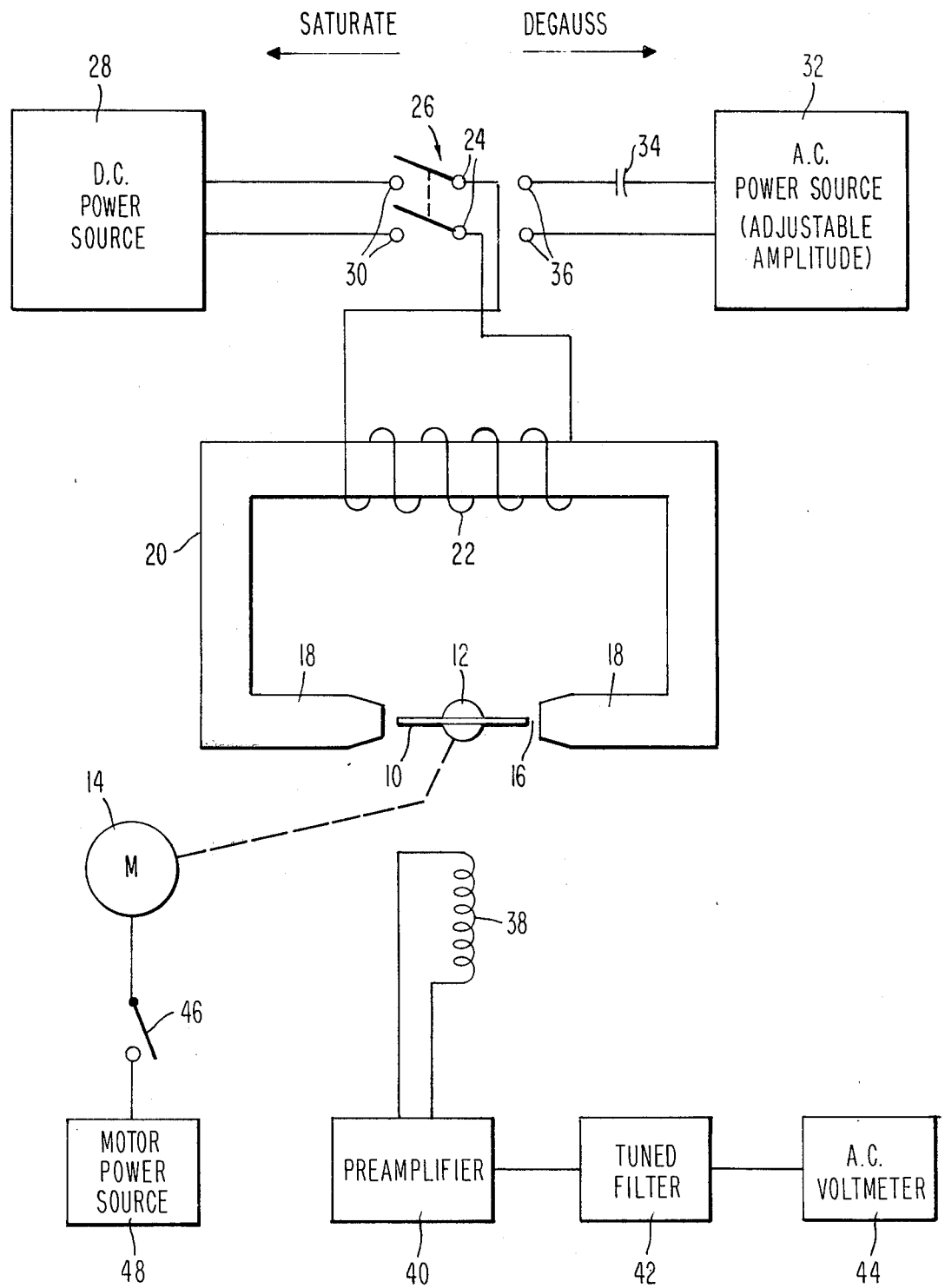

SYSTEM FOR ROTATING SMALL PERMANENT MAGNETS WHILE ADJUSTING AND SIMULTANEOUSLY SENSING THE MAGNETIC MOMENTS THEREOF

BACKGROUND OF THE INVENTION

The well-known method of adjusting the magnetic moment of a small bar magnet to a predetermined stable value involves subjecting the magnet to a DC field of sufficient strength to cause saturation. The magnet is then removed from the DC field and is placed in an AC field of slowly increasing peak amplitude, thereby reducing the remanent magnetization. The repeated cycling caused by the AC field insures the attainment of a stable operating point free from minor hysteresis loop effects which would result in irreversible changes with temperature and/or the presence of small external fields.

Unfortunately, the uniformity of ordinary magnetic material is insufficient to permit use of the same peak AC amplitude for a number of magnets being set to a specified moment. Therefore, it is necessary to raise the AC amplitude to a trial value and then remove the degaussing field and measure the magnetic moment. By repeated trials with gradually increasing AC amplitude, the desired moment is obtained. If the moment is inadvertently reduced below its desired value, the magnet must be resaturated and the procedure repeated.

Apparatus to implement the foregoing method includes a magnetizing/degaussing solenoid or yoke and a sensing magnetometer. For convenience, the mangetometer may be mounted to sense the moment of the magnet under adjustment without physically having to remove the magnet to a test station. However, it is generally not possible to sense the moment while the degaussing field is being applied. As noted hereinbefore, it is necessary to alternately apply the AC generated degaussing field, remove the latter, and then read the magnetic moment. The procedure is repeated as many times as necessary to achieve the desired moment of strength. It is apparent that the process is laborious and time consuming. Several complete cycles, each starting with resaturation of the magnet may be required, particularly when the desired value of moment is to be kept within strict tolerances. Moreover, the operation becomes more critical when the moment is on the order of fifty-percent of saturation, since the magnetization curve is steep in this region and small AC field changes result in large moment changes. It is almost impossible to avoid overshooting the target moment value, so that recycling from saturation is often necessary.

SUMMARY OF THE INVENTION

The present invention effectively eliminates the trial and error process detailed hereinbefore and substitutes therefor a coordinated operation. The latter results from the fact that the moment readout is provided continuously during the degaussing process. Readout is achieved by physically rotating the magnet under adjustment so that it alternately aligns with the poles of a degaussing yoke and an orthogonal sensing coil. An AC degaussing field is provided across the yoke gap with the frequency chosen such that several AC cycles occur during the interval wherein approximate alignment of the magnet with the yoke prevails. As the magnet rotates past the pickup coil, a voltage is induced in the latter which is proportional to the magnet flux and hence moment.

The frequency of the voltage induced in the pickup coil is a function of the rotation rate of the magnet. A filter tuned to this frequency provides for the rejection of other components of induced voltage. Finally, the filtered signal is displayed on an indicating device, such as an AC voltmeter, the reading thereon being proportional to the moment.

These and other features of the present invention will be more readily apparent in the detailed description appearing hereinafter.

BRIEF DESCRIPTION OF THE DRAWING

The DRAWING illustrates the system components utilized in an actual operative embodiment of the present invention.

DESCRIPTION OF THE PREFERRED EMBODIMENT

With reference to the drawing, the bar magnet 10 whose moment is to be adjusted is mounted on a spindle 12. The synchronous motor 14 is coupled to the spindle 12 to effect its rotation at a prescribed rate. The spindle 12 with its magnet 10 is positioned in the air gap 16 between the pole pieces 18 of a steel laminated yoke 20. A winding 22 is placed on the yoke and its extremities are connected to the common terminals 24 of a double-pole, double-throw switch 26. A DC power source 28 is connected to terminals 30 of the switch 26; and an adjustable amplitude AC power source 32 is coupled via capacitor 34 to the opposite terminals 36 of the switch 26.

An air core pickup coil 38 is disposed adjacent to the magnet 10 and is oriented orthogonally to the pole pieces 18 and hence to the flux within the gap 16. The extremities of the pickup coil 38 are connected to a preamplifier 40, the output of which is applied to a tuned filter 42. Finally, the filtered output is connected to an indicating device, such as AC voltmeter 44.

In operation, the system performs as follows to produce a magnet of specified moment. The magnet 10 is inserted in the non-rotating spindle 12. Motor 14 is off, the switch 46 to its power source 48 being open. The longitudinal axis of the magnet 10 is aligned with the pole pieces 18 of yoke 20. The switch 26 is activated, closing the path via terminals 30 between the DC power source 28 and winding 22. The magnetic flux generated in the air gap 16 causes the magnet 10 to be saturated.

The saturating field is then terminated by moving switch 26 to its opposite position, closing the path via terminals 36 between the AC power source 32 and yoke winding 22. The motor switch 46 is then closed, turning on motor 14 and with zero output from AC source 32, the reading on AC meter 44 is noted to establish a reference point corresponding to full or 100 percent saturation. Obviously, the meter scale for use in determining different degrees of saturation is thus established.

To degauss the magnet so as to achieve the desired moment, the amplitude of the output of AC source 32 is slowly increased from the zero value. As degaussing commences, the reading on meter 44 drops in value. When the desired level of magnetization is approached, the amplitude of the AC source 32 is quickly reduced to zero.

Certain theoretical considerations in the design of the present system are worthy of mention. It is apparent that total isolation does not exist between the degaussing and sensing operation. At intermediate rotation positions, the magnet is simultaneously producing the flux along the sense coil axis while still being influenced by the degaussing field. This situation would be of no consequence if the magnet flux versus field relationship were a linear one. However, in general, the behavior is nonlinear and some interaction occurs. For moments on the order of 50% or below, this condition is manifested by a drop (approximately 5%) in the AC meter reading when the AC degaussing field is removed. To compensate for this effect, the AC field should be removed slightly before the desired reading is achieved. Since the effect is quite consistent, no operational difficulty results. Moments on the order of 80% or above result in no noticeable change in AC metering upon the removal of the degaussing field.

In order to minimize the above-described interaction, it is helpful to utilize a physically small pickup coil, so that most of the flux change occurs over a small rotation angle near the position orthogonal to the yoke.

Another consideration involves the relationship between the rotational rate of magnet 10 and the frequency of the AC degaussing current. In an actual operative embodiment the motor 14 and spindle 12 rotated at 1800rpm (30rps) and the frequency of the AC source 32 was 400Hz. The magnet 10 was thus subjected to approximately seven cycles of degaussing field between passages of its poles past the pickup coil 38. It is desirable to increase the number of cycles of degaussing field, but core losses in the yoke and magnet eddy currents limit the maximum usable frequency of the degaussing service.

The design of the tuned filter 42 is also related to the rotation rate of the magnet 10. Thus, the frequency of the voltage induced in the pickup coil is determined by the rotation rate and is 30Hz for the 1800rpm motor. A bandpass filter tuned for a 29–31Hz passband with 24DB/octave attenuation beyond the band has been utilized successfully.

Other physical and magnetic parameters involved in a practical embodiment include the Cunife II magnets themselves which are 0.5 inches in length and 0.020 inches in diameter. The winding 22 on yoke 20 contains approximately 3000 turns of #24 wire; the pickup coil is comprised of #42 wire and is 0.5 inches in length and about 0.5 inches in diameter. The DC power source 28 output is 36 volts at 1.5 amperes, and the 400Hz AC supply 32 utilized a 50 watt amplifier driven by a standard laboratory-type audio oscillator. Capacitor 34 has a value which permits series resonance with the yoke winding 22 in order to minimize the driving voltage required. Capacitor 34 must be capable of withstanding about 2000 volts, as must the yoke insulation. The field produced in the gap by the DC saturation source and the AC degaussing source is on the order of several hundred gauss. The yoke design is conventional and well within the skill of electrical designers. The apparatus described is capable of degaussing Cunife II magnets to less than 20% of saturation. It should be understood that the foregoing parameters and equipments while actually employed in a practical embodiment of the invention, have been presented solely for purposes of example as an aid to the reader. Such data is not to be considered limitative of the invention.

In conclusion, the magnet moment adjustment techniques described herein have been particularly useful in handling the large numbers of magnets of different moments required for use in certain electro-magnetic devices. It will be apparent that the real-time sensing capability of the system makes it particularly attractive for automated use. For example, in an automated arrangement, the amplitude of the AC degaussing signal would be permitted to increase slowly from zero and would be reduced to zero by voltage sensing means used in place of, or as an adjunct to, the AC meter. The threshold for the sensing means would be adjustable to give the desired magnet strength.

Changes and modifications of the present system configuration may be required for particular applications. Such are well within the skill of the electrical designers, and insofar as they are encompassed by the true scope and spirit of the invention, are meant to be covered by the claims which follow.

What is claimed is:

1. A system for adjusting the magnetic moment of a bar magnet comprising in combination:

a yoke having a pair of pole pieces separated from each other by an air gap, a winding disposed on said yoke;

a DC power source and an AC power source, means for selectively coupling the last mentioned sources to said winding, spindle means situated within said air gap for rotatably mounting said magnet, drive means coupled to said spindle means to rotate the latter;

the energization of said winding by said DC power source generating a saturating magnetic field in said air gap, said magnet being initially stationary with its extremities aligned with said field and being driven to a saturated state;

the removal of said saturating magnetic field and the subsequent energization of said winding by said AC power source generating a degaussing field of increasing strength in said air gap, said magnet being rotated in a plane parallel to said degaussing field by said drive means and having its moment reduced from said saturated state to a desired level;

a pickup coil positioned in proximity to said rotating magnet and having its axis oriented orthogonally to said degaussing field, the rotation of said magnet causing a voltage to be induced in said coil which is proportional to the magnet flux and to its moment, the flux change resulting in said induced voltage occurring substantially during the rotational interval when said magnet is least influenced by said degaussing field;

amplifier means coupled to said coil, filter means coupled to the output of said amplifier means, and means coupled to the output of said filter means for indicating the amplitude thereof simultaneously with said increasing degaussing field strength, said amplitude being proportional to the magnet moment.

2. A moment adjusting system as defined in claim 1 further including a capacitor electrically interposed between said winding and said AC power source and having a value of capacitance such that said winding is series resonant therewith.

3. A moment adjusting system as defined in claim 2 further characterized in that said AC power source includes means for varying the amplitude of its output current supplied to said winding.

4. A moment adjusting system as defined in claim 3 further characterized in that said filter means comprises a bandpass filter tuned to pass the frequency of the signal voltage induced in said pickup coil as determined by the rotation rate of the magnet, and to substantially reject all other frequency components of the induced voltage.

5. A moment adjusting system as defined in claim 4 further characterized in that said means for indicating the output of said filter means is an AC voltmeter.

6. A moment adjusting system as defined in claim 5 further characterized in that said drive means is a synchronous motor.

7. A moment adjusting system as defined in claim 6 further characterized in that said synchronous motor rotates said spindle means at 1800rpm whereby the voltage induced in said pickup coil has a frequency of 30Hz, said bandpass filter being tuned to 29–31Hz.

8. A moment adjusting system as defined in claim 7 wherein the frequency of said AC power source is 400Hz.

9. The method of adjusting the moment of a magnet comprising the steps of:
- applying a DC generated saturating magnetic field to said magnet;
- terminating said saturating magnetic field and applying an AC generated degaussing field of increasing strength to said magnet while rotating the latter in a plane parallel to said degaussing field;
- simultaneously sensing the magnetic flux and moment of the rotating magnet; and
- terminating said degaussing field upon attainment of the desired magnet moment.

* * * * *